(12) United States Patent
Kim et al.

(10) Patent No.: US 7,426,149 B2
(45) Date of Patent: Sep. 16, 2008

(54) SEMICONDUCTOR MEMORY MODULE AND SEMICONDUCTOR MEMORY DEVICE

(75) Inventors: Seok-Il Kim, Seoul (KR); You-Keun Han, Yongin-si (KR); Hoe-Ju Chung, Yongin-si (KR); Young-Man Ahn, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 166 days.

(21) Appl. No.: 11/540,607

(22) Filed: Oct. 2, 2006

(65) Prior Publication Data
US 2007/0171740 A1    Jul. 26, 2007

(30) Foreign Application Priority Data
Jan. 25, 2006    (KR)    .................... 10-2006-0007852

(51) Int. Cl.
*G11C 7/00*    (2006.01)
(52) U.S. Cl. .................................. 365/201; 365/189.05
(58) Field of Classification Search ................ 365/201, 365/63, 189.05; 714/727
See application file for complete search history.

(56) References Cited
U.S. PATENT DOCUMENTS
7,167,404 B2 * 1/2007 Pathak et al. ................ 365/201
7,173,840 B2 * 2/2007 Krause et al. ................ 365/63
7,272,757 B2 * 9/2007 Stocken ....................... 714/718

FOREIGN PATENT DOCUMENTS
JP    2001-210095    8/2001
KR    2003-0075160    9/2003

* cited by examiner

*Primary Examiner*—Vu A Le
(74) *Attorney, Agent, or Firm*—Volentine & Whitt, PLLC

(57) ABSTRACT

A semiconductor memory module and a semiconductor memory device are disclosed. In one embodiment, the invention provides a semiconductor memory module comprising a circuit board, a plurality of semiconductor memory devices adapted to operate during a test mode and a normal operation mode and mounted on the circuit board, a first signal line set comprising a plurality of first signal lines connected to the plurality of semiconductor memory devices, and a plurality of second signal line sets. Each semiconductor memory device comprises first terminals adapted to receive first signals from the first signal lines, second terminals connected to a corresponding one of the second signal line sets, a third terminal adapted to receive an enable signal during the test mode, and a signal transmitting unit adapted to output second signals to the second terminals in response to the enable signal.

26 Claims, 8 Drawing Sheets

SEMICONDUCTOR MEMORY MODULE AND SEMICONDUCTOR MEMORY DEVICE

BACKGROUND

1. Field of the Invention

Embodiments of the invention relate to a semiconductor memory modules and related semiconductor memory devices. In particular, embodiments of the invention relate to modules enabling signal line short circuit testing of individual devices. Embodiments of the invention also relate to semiconductor memory devices in which signal line short circuit testing can be performed on individual terminals.

This application claims priority to Korean Patent Application No. 2006-0007852, filed on Jan. 25, 2006, the subject matter of which is hereby incorporated by reference in its entirety.

2. Description of Related Art

As the respective sizes of electronic components in electronic devices become smaller, the degree of integration of circuit boards comprising the electronic components increases. Thus, the respective sizes of electronic devices comprising the circuit boards may be reduced. However, as packaged semiconductor memory devices decrease in size, and semiconductor memory devices are arranged more densely on a circuit board, bad connections increasingly arise between the circuit board and the semiconductor memory devices (i.e., components) mounted on the circuit board at terminals of the semiconductor memory devices. In addition, checking connections between semiconductor memory devices and a circuit board is difficult, so a convenient and precise technique for checking connections between semiconductor memory device terminals and the circuit board on which the semiconductor memory device is mounted is needed.

One technique for testing connections between component terminals and a corresponding circuit board is a boundary scanning technique, which was standardized in IEEE/ANSI 1491.1. The boundary scanning technique can be applied to logic circuits such as microprocessors or application specific integrated circuits (ASICs).

Figure (FIG.) 1 is a block diagram illustrating a semiconductor memory module that is tested using a conventional boundary scanning technique. The semiconductor memory module of FIG. 1 comprises electronic components 10a and 10b, a circuit board 20, and a wiring pattern 30. Electronic components 10a and 10b and circuit board 20 each comprise a test data input terminal TDI, a test mode selecting terminal TMS, a test clock terminal TCK, and a test data output terminal TDO (which may be referred to collectively as test terminals TDI, TMS, TCK and TDO). Test terminals TDI, TMS, TCK and TDO are only used for performing tests, and test terminals TDI, TMS, TCK and TDO of each element (such as electronic component 10a and circuit board 20) in the semiconductor memory module of FIG. 1 are respectively connected to corresponding test terminals TDI, TMS, TCK and TDO of another element(s) of the semiconductor memory module of FIG. 1 by wiring pattern 30 formed on circuit board 20.

Each of electronic components 10a and 10b comprises a test circuit comprising a plurality of BS cells 40, an instruction register (IR) 50, a bypass register 60, and a tap controller 70. In electronic component 10a, for example, BS cells 40 are arranged so that they each correspond to a terminal connected to a core portion 80, and each of BS cells 40 also has a latching function. Instruction register 50 recognizes a test instruction received from test data input terminal TDI. Bypass register 60 outputs data supplied from test data input terminal TDI directly to test data output terminal TDO. In addition, tap controller 70 decodes a test mode signal received from test mode selecting terminal TMS.

When a plurality of electronic components 10a and 10b are mounted on circuit board 20, as shown in FIG. 1, since test data output terminal TDO of electronic component 10a is connected to test data input terminal TDI of the adjacent electronic component 10b, a scanning path loop (indicated in FIG. 1 by a bold, solid line) is formed in circuit board 20.

A controller (not shown), which is disposed outside of and is connected to circuit board 20, controls the test terminals of electronic components 10a and 10b and circuit board 20 so that electronic components 10a and 10b and circuit board 20 can receive a test instruction and an input pattern through test data input terminal TDI.

Each test circuit of electronic components 10a and 10b operates in response to the input instruction and the input pattern and outputs an output pattern through its test data output terminal TDO.

The controller then compares the output pattern to an expected pattern to check the state of connections between the terminals of electronic components 10a and 10b and circuit board 20 and thereby detects defects such as soldering defects related to the terminals or mounting location defects related to electronic components 10a and 10b.

However, the boundary scanning technique described above requires terminals dedicated for performing the test and a plurality of test circuits arranged in the electronic components, which affects chip size. In addition, the boundary scanning technique requires a special algorithm for applying the test instruction and the input pattern to enter into the test mode.

In addition, a memory system comprises a memory control circuit and a plurality of memory modules, wherein each of the memory modules comprises a plurality of semiconductor memory devices. Each data signal line of a plurality of data signal lines is directly connected to one of the semiconductor memory devices of the plurality of semiconductor memory devices of the memory module in a pin to pin method. However, address signals, instruction signals, and control signals are applied to the plurality of semiconductor memory devices via a single signal line.

Short circuit tests can be performed on individual pins of semiconductor memory devices that are each connected to a respective data signal line of a plurality of data signal lines in a pin to pin method. However, when a plurality of address signals are applied to a plurality of semiconductor memory devices via a single signal line, as in the conventional boundary scanning technique, testing whether an individual pin connected to the single signal line has been short-circuited is impossible because, when one pin is short-circuited, all of the pins connected to that line are short-circuited. In addition, when a connection problem arises, it is impossible to individually test the semiconductor memory devices in order to locate the problem.

SUMMARY OF THE INVENTION

Embodiments of the invention provide a semiconductor memory module and a semiconductor memory device in which a signal line short circuit test can be performed on each semiconductor memory device of a plurality of semiconductor memory devices individually when a signal line set is shared by the plurality of semiconductor memory devices and each semiconductor memory device has the same number of test target pins and monitor pins. In addition, the semiconductor memory devices may be individually tested without using an additional test dedicated pin or an algorithm for entering into the test mode.

Embodiments of the invention also provide a semiconductor memory module and a semiconductor memory device in which a signal line short circuit test can be performed on each semiconductor memory device of a plurality of semiconductor memory devices individually by individually connecting a signal line connected to a selected test target pin to a monitor pin, wherein a signal line set is shared by multiple of the semiconductor memory devices, the signal line set comprises the signal line, and each semiconductor memory device comprises more test target pins than monitor pins.

In one embodiment, the invention provides a semiconductor memory module comprising a plurality of semiconductor memory devices adapted to operate during a test mode and a normal operation mode and a circuit board having the plurality of semiconductor memory devices mounted thereon, a first signal line set comprising a plurality of first signal lines commonly connected to the plurality of semiconductor memory devices and a plurality of second signal line sets individually connected to the plurality of semiconductor memory devices. Each semiconductor memory device comprises first terminals adapted to receive first signals from the first signal lines, second terminals connected to a corresponding one of the second signal line sets, a third terminal adapted to receive an enable signal during the test mode, and a signal transmitting unit connected to the first terminals and adapted to output second signals to the second terminals in response to the enable signal, wherein the second terminals are adapted to output the second signals.

In another embodiment, the invention provides a semiconductor memory device adapted to operate during a test mode and a normal operation mode comprising an input switching unit and an output switching unit. The input switching unit is adapted to receive first signals from a plurality of first terminals, receive an enable signal from a second terminal during the test mode, and provide the first signals to an output switching unit. The output switching unit adapted to receive the enable signal from the second terminal during the test mode, and output the first signals to third terminals in response to the enable signal.

In yet another embodiment, the invention provides a semiconductor memory module comprising a plurality of semiconductor memory devices adapted to operate during a test mode and a normal operation mode; and a circuit board having the plurality of semiconductor memory devices mounted thereon, a first signal line set comprising a plurality of first signal lines commonly connected to the plurality of semiconductor memory devices and a plurality of second signal line sets individually connected to the plurality of semiconductor memory devices. Each semiconductor memory device comprises first terminals adapted to receive first signals from the first signal lines, second terminals connected to a corresponding one of the second signal line sets and adapted to receive and output selecting signals during the test mode, and a third terminal adapted to receive an enable signal during the test mode, a selecting control signal generating unit adapted to logically combine the selecting signals to generate and output selecting control signals in accordance with the enable signal, an input switching unit adapted to output a second signal in response to the selecting control signals, and a fourth terminal adapted to output the second signal received from the input switching unit, wherein the corresponding one of the second signal line sets comprises a plurality of second signal lines, one of the second signal lines is connected to the fourth terminal, and others of the second signal lines are connected to the second terminals.

In still another embodiment, the invention provides a semiconductor memory device adapted to operate during a test mode and normal operation mode comprising a selecting control signal generating unit connected to an output switching unit, an input switching unit connected to the selecting control signal generating unit, a plurality of first terminals connected to the input switching unit and adapted to receive first signals, a plurality of second terminals adapted to provide a plurality of selecting signals to the selecting control signal generating unit, and a switching controller adapted to provide a first control signal to the output switching unit in accordance with receiving an enable signal from a third terminal and adapted to provide a second control signal to the selecting control signal generating unit in accordance with receiving the enable signal. The selecting control signal generating unit is adapted to provide selecting control signals to the input switching unit to select one of the first terminals, receive a second signal from the selected first terminal, and provide the second signal to the output switching unit. In addition, the input switching unit is adapted to provide the second signal from the selected first terminal to the selecting control signal generating unit, and the output switching unit is adapted to provide the second signal to a fourth terminal in response to the first control signal.

BRIEF DESCRIPTION OF THE DRAWINGS

Embodiments of the invention will be described herein with reference to the accompanying drawings, in which like reference symbols indicate like elements throughout. In the drawings.

DESCRIPTION OF EMBODIMENTS

As used herein, the terms "first," "second," etc., are only used for convenience of description.

Figure 1:
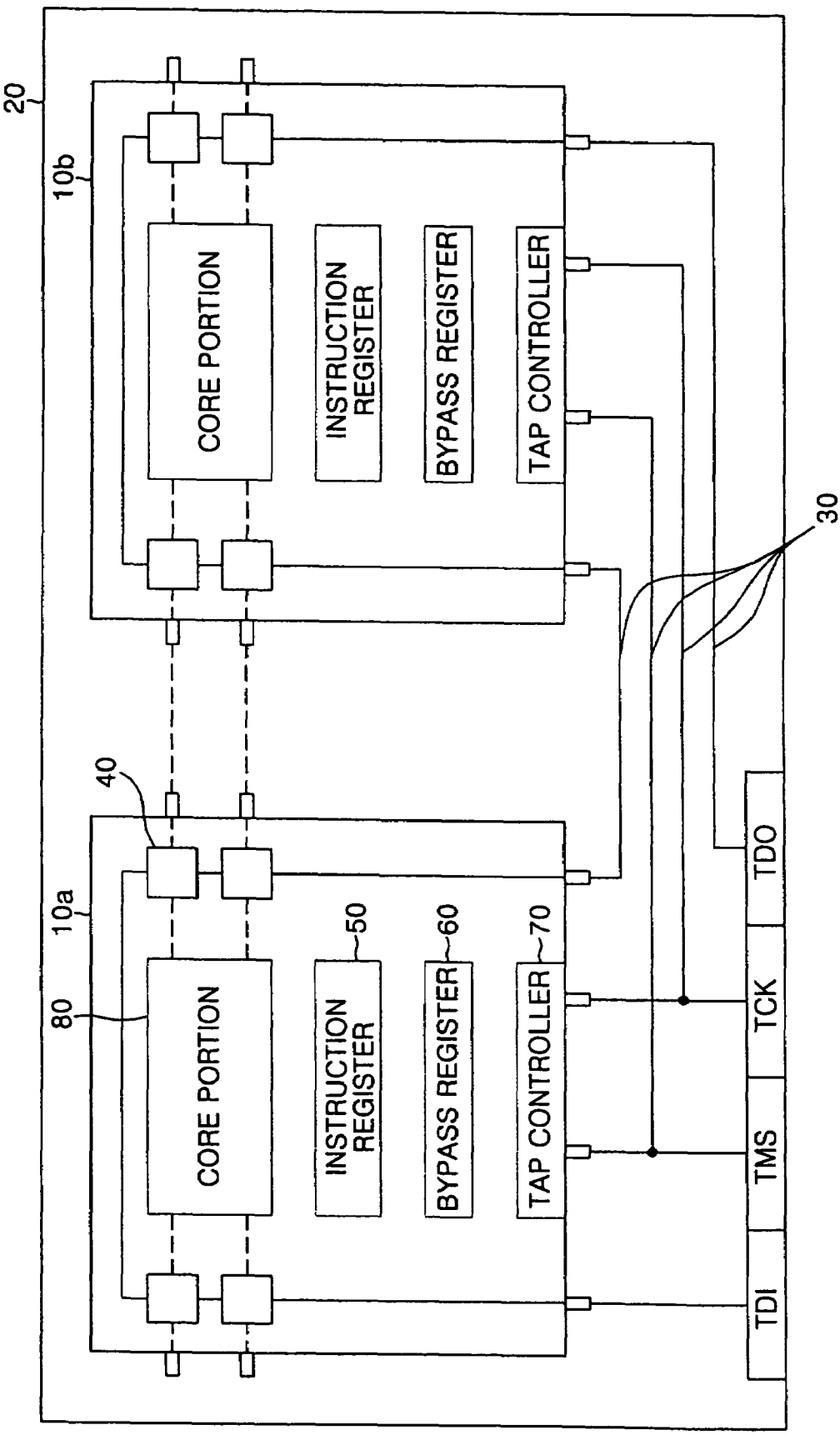
FIG. 1 is a block diagram illustrating a semiconductor memory module in which a conventional boundary scanning technique is used.
Figure 2:
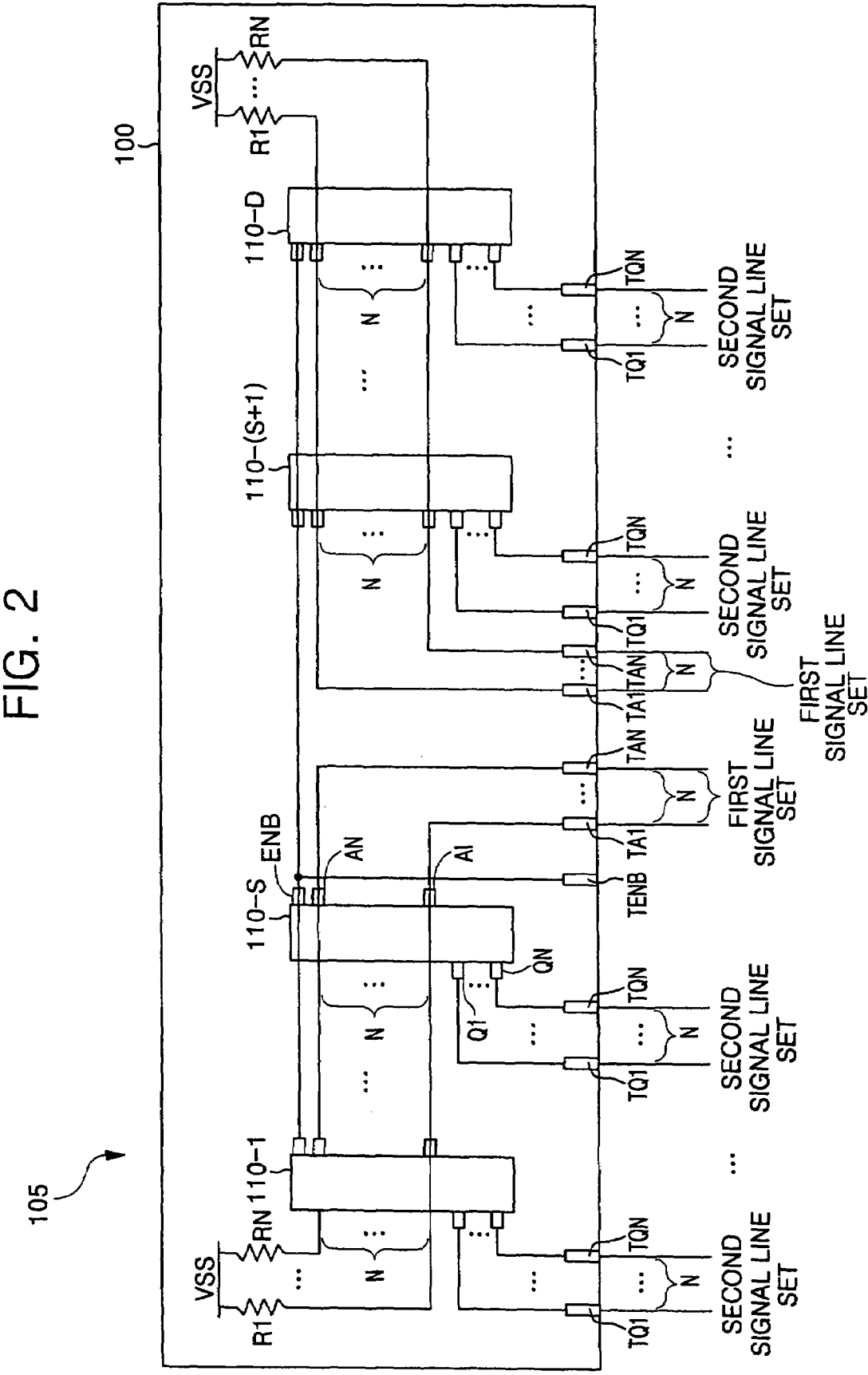
FIG. 2 is a block diagram illustrating a configuration of a memory module in accordance with an embodiment of the invention.

FIG. 2 is a block diagram illustrating a configuration of a memory module in accordance with an embodiment of the invention in which there is an equal number of test target pins and monitor pins in each semiconductor memory device of the memory module. Memory module 105 of FIG. 2 comprises a circuit board 100, a plurality of semiconductor memory devices 110-1 through 110-D comprising semiconductor memory devices 110-S and 110-(S+1), wherein D and S are positive integers and D is greater than (S+1). Also, each of semiconductor memory devices 110-1 through 110-D is adapted to operate during a test mode and a normal operation mode. Memory module 105 further comprises a plurality of first signal line sets, wherein each first signal line set comprises a plurality of first signal lines, and a plurality of second signal line sets, wherein each second signal line set comprises a plurality of second signal lines. Memory module 105 still further comprises a plurality of monitor memory module taps TQ1 through TQN, a plurality of pin memory module taps TA1 through TAN, and an enable memory module tap TENB. Memory module 105 also comprises a plurality of terminal resistors R1 through RN. Each of semiconductor memory devices 110-1 through 110-D comprises test target pins A1 through AN, a test enable pin ENB, and monitor pins Q1 through QN. Each of semiconductor memory devices 110-1 through 110-D also comprises an input switching unit 200 (see FIG. 3), an output switching unit 300 (see FIG. 3), and a signal transmitting portion 400.

Semiconductor memory devices 110-1 through 110-D are mounted on circuit board 100. Each first signal line is connected to one of pin memory module taps TA1 through TAN of circuit board 100, is connected to multiple semiconductor memory devices of semiconductor memory devices 110-1 through 110-D, and is connected to a ground voltage via one of terminal resistors R1 through RN. A first signal line is connected to a semiconductor memory device of semiconductor memory devices 110-1 through 110-D through one of test target pins A1 through AN of the semiconductor memory device. Circuit board 100 is electrically connected to the respective test target pins A1 through AN, monitor pins Q1 through QN, and test enable pin ENB of semiconductor memory devices 110-1 through 110-D through pin memory module taps TA1 through TAN, monitor memory module taps TQ1 through TQN, and enable memory module tap TENB, respectively. Pin memory module taps TA1 through TAN, monitor memory module taps TQ1 through TQN, and enable memory module tap TENB are disposed at a lower portion of circuit board 100, as illustrated in FIG. 2.

The first signal lines are adapted to communicate addresses, instructions, and control signals between semiconductor memory devices 110-1 through 110-D and an external device(s) (i.e., a device(s) outside of memory module 105). The second signal lines communicate data between semiconductor memory devices 110-1 through 110-D and an external device(s). Pin memory module taps TA1 through TAN, monitor memory module taps TQ1 through TQN, and enable memory module tap TENB electrically connect circuit board 100 to test target pins A1 through AN, monitor pins Q1 through QN, and test enable pin ENB, respectively, of semiconductor memory devices 110-1 through 110-D to communicate addresses or data signals between memory module 105 (i.e., semiconductor memory module 105) and an external device(s) or to apply and measure electrical signals, i.e., voltage or current signals, for a semiconductor memory device test.

Each semiconductor memory device 110-Y of semiconductor memory devices 110-1 through 110-D (wherein Y is a positive integer between 1 and D, inclusive) comprises a signal transmitting unit 400 (see FIG. 3) adapted to test individual test target pins A1 through AN of semiconductor memory device 110-Y. When a test enable signal BPEN is provided to enable memory module tap TENB (and is thereby provided to enable pin ENB of semiconductor memory device 110-Y), and a test electrical signal (i.e., a test voltage or current signal) is provided to each of pin memory module taps TA1 through TAN, individual test target pins A1 through AN may be connected to monitor pins Q1 through QN of semiconductor memory device 110-Y through signal transmitting unit 400, and in particular through input switching unit 200 and output switching unit 300 (see FIG. 3) in response to test enable signal BPEN, in order to test individual test target pins A1 through AN of semiconductor memory device 110-Y. Thus, test target pins A1 through AN of semiconductor memory device 110-Y, which are connected to first signal lines that are also connected to test target pins A1 through AN of another semiconductor memory device(s), may be tested individually.

An operation of memory module 105 of FIG. 2 will be described below.

When first signal lines are simultaneously connected to test target pins A1 through AN of multiple semiconductor memory devices of semiconductor memory devices 110-1 through 110-D of memory module 105, a signal line short circuit test of a selected semiconductor memory device 110-X (wherein X is a positive integer between 1 and D, inclusive) is performed as follows during a test mode. A test voltage or current (i.e., a test voltage or a test current) is applied to pin memory module taps TA1 through TAN that correspond to selected semiconductor memory device 110-X, and test enable signal BPEN is applied through enable memory module tap TENB to connect pin memory module taps TA1 through TAN to corresponding monitor pins Q1 through QN of selected semiconductor memory device 110-X through a control operation performed by selected semiconductor memory device 110-X. Then, corresponding monitor memory module taps TQ1 through TQN receive resultant voltages or currents (i.e., resultant voltages or resultant currents) from monitor pins Q1 through QN of selected semiconductor memory device 110-X, and the respective values of the resultant voltages or currents are measured at corresponding taps of monitor memory module taps TQ1 through TQN. That is, whether or not a signal line short circuit has occurred in selected semiconductor memory device 110-X is tested by determining whether or not the values of the received resultant voltages or currents, which are measured at monitor memory module taps TQ1 through TQN, are substantially equal to the test voltage or current. In addition, the preceding testing operation is performed during a test mode in the embodiment described with reference to FIGS. 2 and 3.

Figure 3:
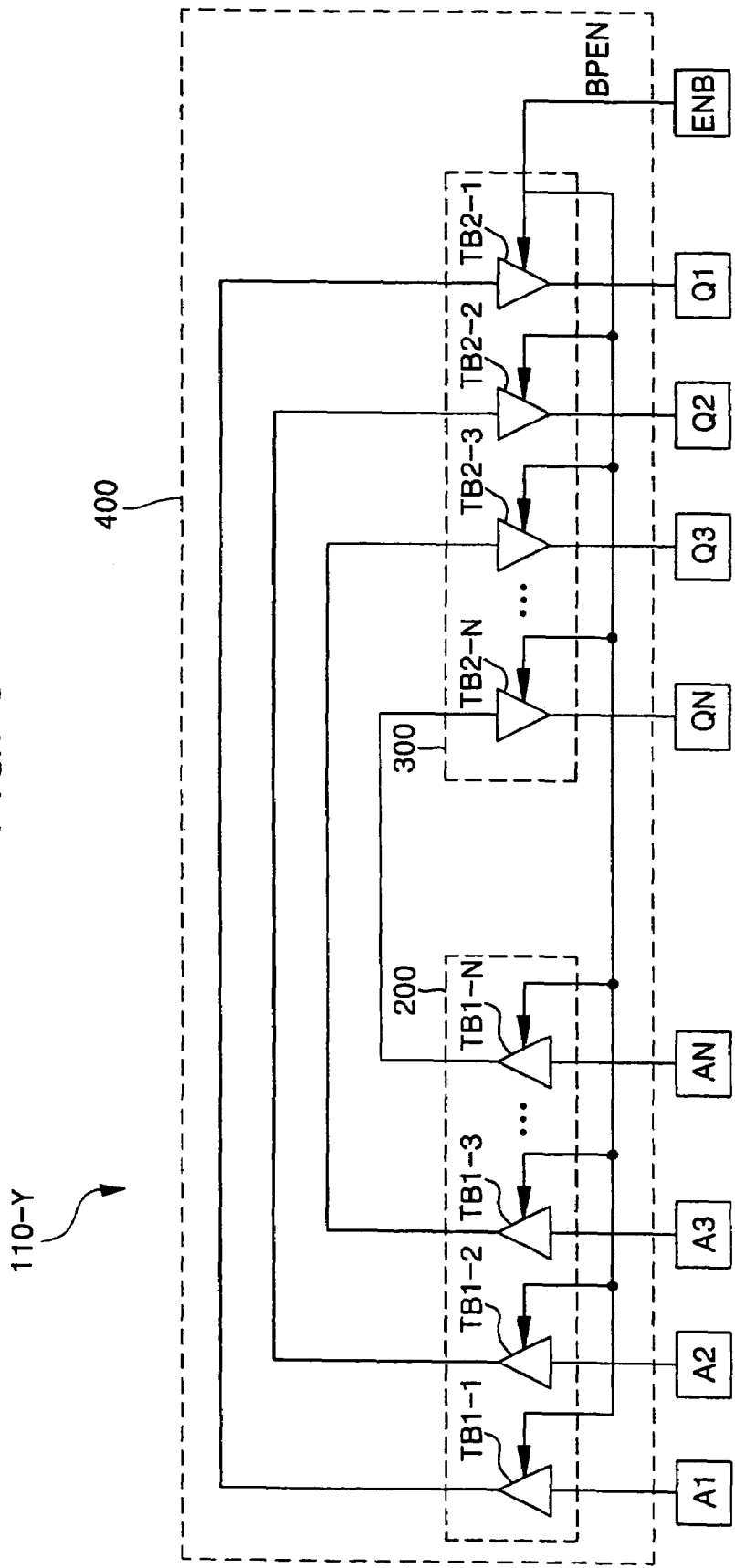
FIG. 3 is a block diagram illustrating a configuration of a semiconductor memory device of the memory module of FIG. 2.

FIG. 3 is a block diagram illustrating a configuration of a semiconductor memory device 110-Y of FIG. 2 in accordance with an embodiment of the invention. Semiconductor memory device 110-Y of FIG. 3 has an equal number of test target pins A1 through AN and monitor pins Q1 through QN. Semiconductor memory device 110-Y comprises an input switching unit 200, an output switching unit 300, a plurality of test target pins A1 through AN, a plurality of monitor pins Q1 through QN, and a test enable pin ENB. Input switching unit 200 comprises a plurality of tri-state buffers TB1-1 through TB1-N, and output switching unit 300 comprises a plurality of tri-state buffers TB2-1 through TB2-N.

A first side of each of test target pins A1 through AN is connected to a ground voltage, and second sides of test target pins A1 through AN are respectively connected to monitor pins Q1 through QN by a bus through input and output switching units 200 and 300. Test target pins A1 through AN are also connected to pin memory module taps TA1 through TAN, respectively. Monitor pins Q1 through QN are connected to output terminals of tri-state buffers TB2-1 through TB2-N of output switching unit 300 and are connected the monitor memory module taps TQ1 through TQN, respectively. Test enable pin ENB is preferably a no connection (NC) pin, a voltage reference (VREF) pin, or a /RESET pin. In addition, test enable pin ENB is connected to enable memory module tap TENB. A test enable signal BPEN is provided to control terminals of each of tri-state buffers TB1-1 through TB1-N and TB2-1 through TB2-N of input and output switching units 200 and 300, respectively, through test enable pin ENB. The NC pin is a pin which is not used during a normal operation mode of memory module 105 and thus does not cause any problem in the normal operation mode. However, the VREF and/or /RESET pins may cause a malfunction if used during normal operation mode. So, in certain embodiments I t may be wise to apply test enable signal BPEN outside the period of normal operation. addition, test target pins A1 through AN may be adapted to receive a control signal during the normal operation mode, and monitor pins Q1 through QN may be adapted to output data during a normal operation mode. The control signal may comprise an address signal and an instruction signal.

Functions of components of semiconductor memory device 110-Y of FIG. 3 are described below.

In response to test enable signal BPEN, switching input unit 200 selects test target pins A1 through AN and connects the first signal lines connected to test target pins A1 through AN to corresponding monitor pins Q1 through QN through output switching unit 300. That is, test target pins A1 through AN, which are connected to first signal lines, provide resultant voltages or currents (i.e., resultant signals) to switching input unit 200, which then provides the resultant voltages or currents to monitor pins Q1 through QN through output switching unit 300. Test enable pin ENB receives test enable signal BPEN from outside of circuit board 100 (i.e., from an external device), and output switching unit 300 selects monitor pins Q1 through QN, in response to test enable signal BPEN, to connecting monitor pins Q1 through QN to test target pins A1 through AN, respectively, through input switching unit 200. Test target pins A1 through AN receive a test voltage or current (i.e., a test voltage or a test current) to test test target pins A1 through AN of semiconductor memory device 110-Y (i.e., the selected semiconductor memory device). Monitor pins Q1 through QN monitor whether the resultant voltages or currents provided to monitor pins Q1 through QN are substantially equal to the test voltage or current provided to test target pins A1 through AN to determine whether or not a signal line short circuit has occurred in semiconductor memory device 110-Y.

An operation of semiconductor memory device 110-Y of FIG. 3 will now be described with reference to FIGS. 2 and 3.

When, as illustrated in FIG. 2, first signal lines are connected to test target pins A1 through AN of semiconductor memory device 110-Y, and when semiconductor memory device 110-Y is selected (i.e., will be tested) during a test mode, a test voltage or current is applied to test target pins A1 through AN of selected semiconductor memory device 110-Y, and monitor pins Q1 through QN of selected semiconductor memory device 110-Y are connected to test target pins A1 through AN through switching operations of input and output switching units 200 and 300 in response to test enable signal BPEN of test enable pin ENB. Thus, test target pins A1 through AN provide resultant voltages or currents to monitor pins Q1 through QN. Then, whether or not a signal line short circuit has occurred in selected semiconductor memory device 110-Y is determined in accordance with whether the values of the resultant voltages or currents are substantially the same as the value of the test voltage or current.

That is, when test enable signal BPEN has a logic high level, test enable signal BPEN having the logic high level is provided to the control terminals of all of tri-state buffers TB1-1 through TB1-N of input switching unit 200 and all of tri-state buffers TB2-1 through TB2-N of output switching unit 300, which are thus opened. As used herein, when a tri-state buffer is said to be "opened" it means that the tri-state buffer is enabled such that a signal provided to the input terminal of the tri-state buffer is output from the output terminal of the tri-state buffer. Thus, a test voltage or current is provided to test target pins A1 through AN of a selected semiconductor memory device 110-Y, test target pins A1 through AN provide resultant voltages or currents to respective monitor pins Q1 through QN of selected semiconductor memory device 110-Y, and the resultant voltages or currents are then measured and compared with the test voltage or current to determine whether a signal line short circuit has occurred in selected semiconductor memory device 110-Y.

Figure 4:
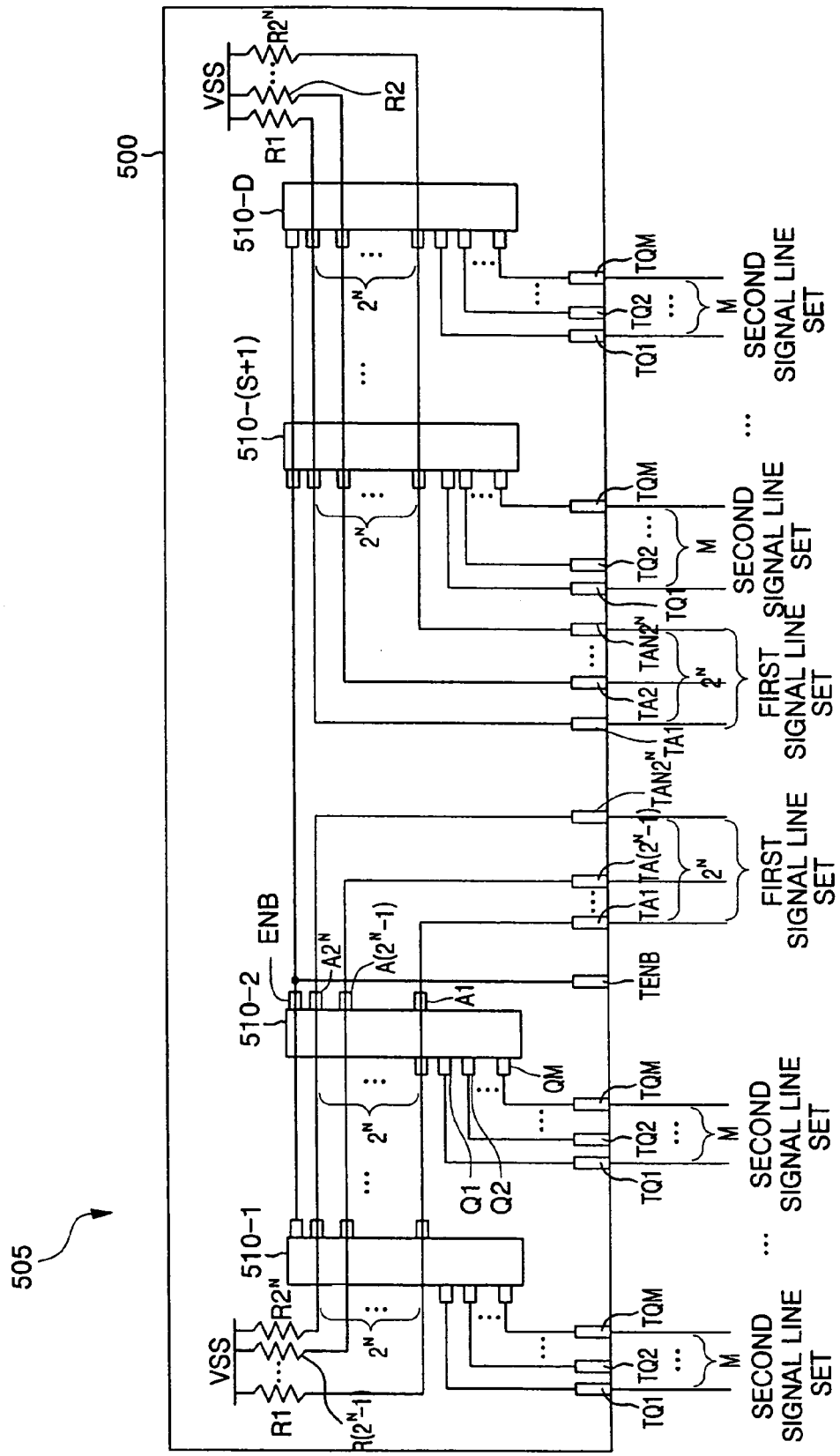
FIG. 4 is a block diagram illustrating a configuration of a memory module in accordance with another embodiment of the invention.

FIG. 4 is a block diagram illustrating a configuration of a memory module 505 in accordance with an embodiment of the invention. Memory module 505 comprises a circuit board 500, a plurality of semiconductor memory devices 510-1 through 510-D comprising semiconductor memory devices 510-S and 510-(S+1). Also, each of semiconductor memory devices 510-1 through 510-D is adapted to operate during a test mode and a normal operation mode. Memory module 505 further comprises a plurality of first signal line sets, wherein each first signal line set comprises a plurality of first signal lines, and a plurality of second signal line sets, wherein each second signal line set comprises a plurality of second signal lines. Memory module 505 still further comprises a plurality of monitor memory module taps TQ1 through TQM, a plurality of pin memory module taps TA1 through TAN, and an enable memory module tap TENB. Memory module 505 also comprises a plurality of terminal resistors R1 through $R2^N$. Each of semiconductor memory devices 510-1 through 510-D comprises test target pins A1 through $A2^N$, a test enable pin ENB, an input switching unit 600 (see FIG. 5), an output switching unit TB2-1 (see FIG. 5), a switching controller 800, and a monitor pin Q1, and selecting pins Q2 through QM. Each of semiconductor memory devices 510-1 through 510-D of memory module 505 comprises more test target pins A1 through $A2^N$ than monitor pins (since each of semiconductor memory devices 510-1 through 510-D comprises one monitor pin Q1). In addition, in the embodiment described with reference to FIGS. 4 through 8, N and M are positive integers greater than 0, and N is greater than M. In addition, test target pins A1 through AN may be adapted to receive a control signal during the normal operation mode, monitor pins Q1 through QN may be adapted to output data during a normal operation mode, and test enable pin ENB may not receive any signal during a normal operation mode. The control signal may comprise an address signal and an instruction signal.

In the embodiment described with reference to FIGS. 2 and 3, the number of test target pins A1 through AN (N) is equal to the number of monitor pins Q1 through QN (also N). However, in the embodiment described with reference to FIGS. 4 through 8, the number of test target pins A1 through $A2^N$ ($2^N$) is greater than the number of monitor pins Q1 (1) and the number of selecting pins Q2 through QM (M−1). The number "N" used in the embodiment described with reference to FIGS. 2 and 3 is not necessarily correlated to the number "N" used in the embodiment described with reference to FIGS. 4 through 8.

In the embodiment described with reference to FIGS. 4 through 8, the first signal lines (and first signal line sets), the second signal lines (and the second signal line sets), pin memory module taps TA1 through TAN, monitor memory module taps TQ1 through TQN, and enable memory module tap TENB all have substantially the same in function as in the embodiment described with reference to FIGS. 2 and 3. However, in the embodiment described with reference to FIGS. 4 through 8, selecting control signals SCON1 through SCON2$^N$ are generated in accordance with a combination of selecting signals S[2] through S[M] that are individually provided to input switching unit 600 (of FIG. 5) in order to select one of the first signal lines to connect to monitor pin Q1. Thus, test target pins A1 through A2$^N$, which are more numerous than selecting pins Q2 through QM, can be tested individually.

An operation of memory module 505 of FIG. 4 (i.e., semiconductor memory module 505) in accordance with an embodiment of the invention will be described below.

In memory module 505 of FIG. 4, providing a test enable signal BPEN to a test enable pin module tap TENB and applying a test electrical signal (i.e., a test voltage or current) to test target pin module taps TA1 through TA2$^N$ during a test mode is the same as in the embodiment described with reference to FIGS. 2 and 3 (except that, in the embodiment described with reference to FIGS. 4 through 8, there are a different number of test target pin module taps to which to apply the electrical signal). Unlike the embodiment described with reference to FIGS. 2 and 3, in the embodiment described with reference to FIGS. 4 through 8, selecting control signals SCON1 to SCON2$^N$, which are generated through logically combining selecting signals S[2] to S[M], are provided to input switching unit 600 in order to connect an individual first signal line of a plurality of first signal lines to monitor pin Q1 (i.e., to provide a resultant voltage or current from a selected test target pin AY to monitor pin Q1), wherein first signal lines of a first signal line set are simultaneously connected to test target pins A1 through A2$^N$ of multiple of semiconductor memory devices 510-1 through 510-D. In addition, each of test target pins A1 through A2$^N$ of each of semiconductor memory devices 510-1 through 510-D is connected one of the first signal lines of one of the first signal line sets. Thus, test target pins A1 through A2$^N$ of each of semiconductor memory devices 510-1 through 510-D can be individually tested, wherein each semiconductor memory device has more test target pins A1 through A2$^N$ than monitor pins (i.e., monitor pin Q1). In addition, test operations are performed during a test mode in the embodiment described with reference to FIGS. 4 through 8.

Figure 5:
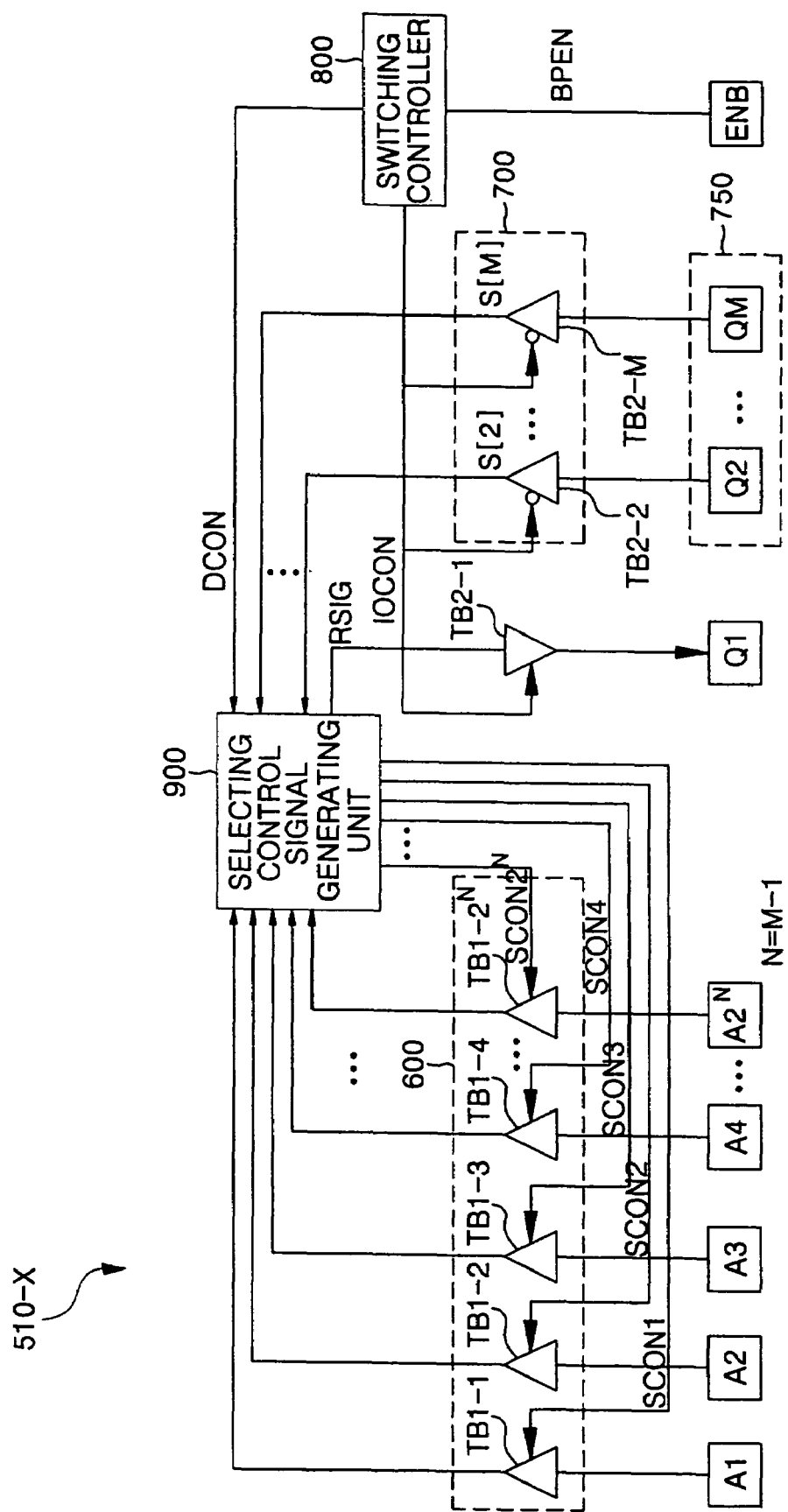
FIG. 5 is a block diagram illustrating a semiconductor memory device of the memory module of FIG. 4.

FIG. 5 is a block diagram illustrating a semiconductor memory device 510-X of FIG. 4 in accordance with an embodiment of the invention, wherein X is an integer between 1 and D, inclusive. Semiconductor memory device 510-X of FIG. 5 comprises more test target pins A1 through A2$^N$ than monitor pins (semiconductor memory device 510-X comprises one monitor pin Q1) or selecting pins Q2 through QM. Semiconductor memory device 510-X comprises a plurality of test target pins A1 through A2$^N$, an input switching unit 600, an output switching unit TB2-1, a selecting control signal generating unit 900, a switching controller 800, a selecting signal switching unit 700, a selecting signal input unit 750, a monitor pin Q1, and a test enable pin ENB. Input switching unit 600 comprises a plurality of tri-state buffers TBT-1 to TB1-2$^N$, wherein N=M−1, and output switching unit is a tri-state buffer TB2-1. Selecting signal switching unit 700 comprises inverted controlled tri-state buffers TB2-2 through TB2-M, and selecting signal input unit 750 comprises a plurality of selecting pins Q2 through QM (i.e., test target pin selecting pins Q2 through QM).

One side of each of test target pins A1 through A2$^N$ is connected to a ground voltage, and test target pins A1 through A2$^N$ are also connected to input terminals of tri-state buffers TB1-1 to TB1-2$^N$ of input switching unit 600, respectively. Selecting signal input portion 750 is connected to selecting control signal generating unit 900 through selecting signal switching unit 700. Selecting pins Q2 through QM are connected to input terminals of inverted controlled tri-state buffers TB2-2 to TB2-M of selecting signal switching unit 700.

Test enable pin ENB is directly connected to switching controller 800. Switching controller 800 receives test enable signal BPEN from test enable pin ENB and activates each of an input/output (I/O) control signal IOCON and a data latch control signal DCON to a logic high level in accordance with receiving test enable signal BPEN. Selecting signal switching unit 700 receives I/O control signal IOCON. In particular, the control terminals of inverted-control tri-state buffers TB2-2 through TB2-M receive I/O control signal IOCON and respectively output selecting signals S[2] through S[M] in response. Output switching unit TB2-1 receives a resultant voltage or current signal from one of test target pins A1 through A2$^N$ transmitted through selecting control signal generating unit 900, and provides the resultant voltage or current signal to monitor pin Q1.

Selecting control signal generating unit 900 receives data latch control signal DCON, receives selecting signals S[2] through S[M] from selecting signal switching unit 700, and, in accordance with those signals, outputs selecting control signals SCON1 through SCON2$^N$ to select one of test target pins A1 through A2$^N$. Selecting control signal generating unit 900 also receives a resultant signal RSIG (i.e., a resultant voltage or current) from input switching unit 600 and outputs resultant signal RSIG to the input terminal of tri-state buffer TB2-1 (i.e., the input terminal of output switching unit TB2-1).

Functions of components of semiconductor memory device 510-X of FIG. 5 will be explained in more detail below.

Figure 6:
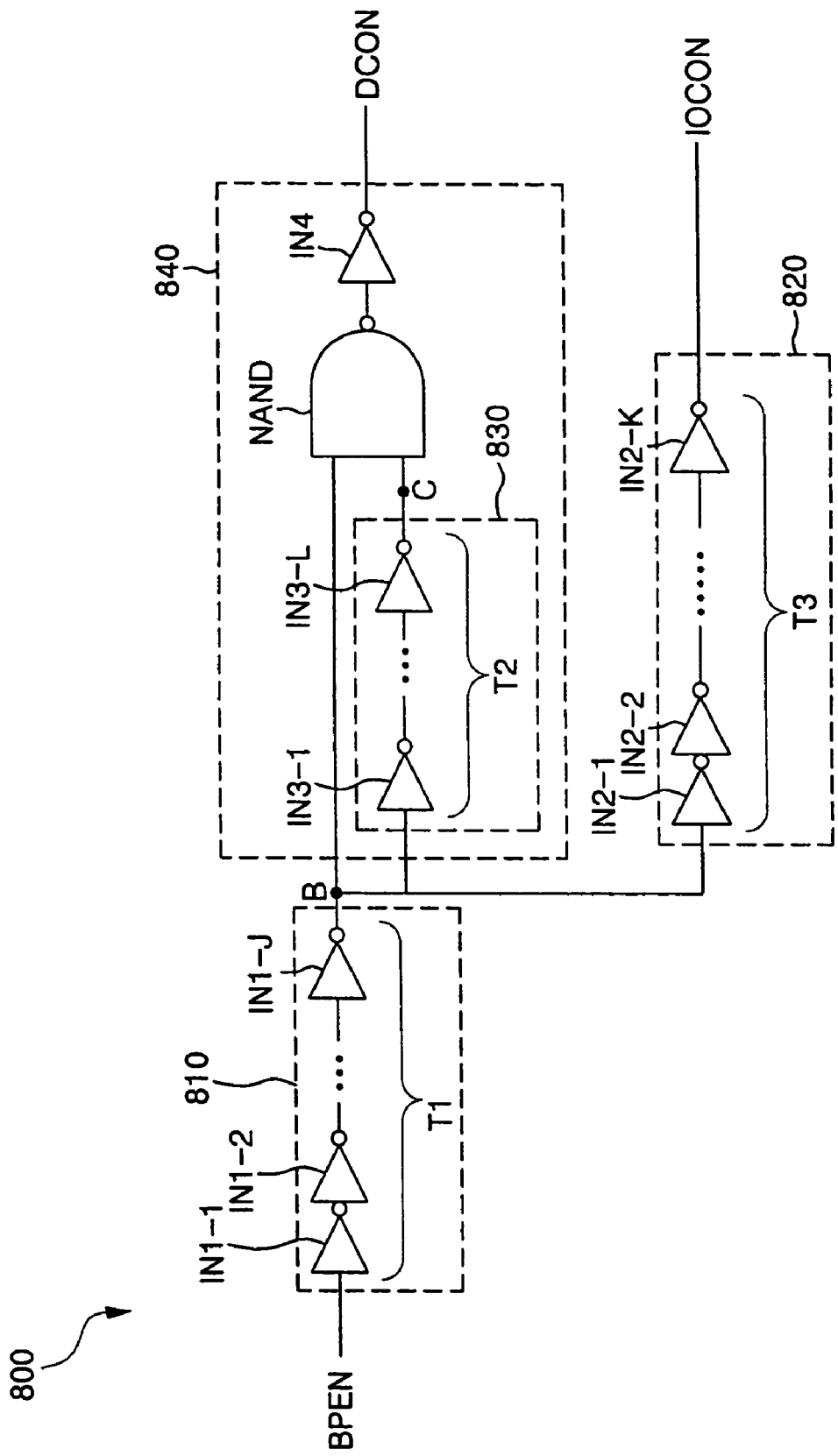
FIG. 6 is a circuit diagram illustrating a switching controller of the semiconductor memory device of FIG. 5.

Referring to FIGS. 5 and 6, to test whether a short circuit has occurred in semiconductor memory device 510-X, test target pins A1 through A2$^N$ receive a test voltage or current through corresponding pin memory module taps TA1 through TA2$^N$, test enable pin ENB receives test enable signal BPEN through a corresponding enable module tap TENB from outside of circuit board 500 (i.e., from an external device) and provides it to semiconductor memory device 510-X, and selecting signal input unit 750 outputs selecting signals S[2] through S[M], which are provided to selecting pins Q2 through QM, which provide selecting signals S[2] through S[M] to selecting signal input unit 750. The test for whether a short circuit has occurred is performed during a test mode.

Switching controller 800 receives test enable signal BPEN and activates each of I/O control signal IOCON and data latch control signal DCON to a logic high level in accordance with receiving test enable signal BPEN. Selecting control signal generating unit 900 connects an individual first signal line, which is connected simultaneously to one of test target pins A1 through A2$^N$ of multiple of semiconductor memory devices 510-1 through 510-D, to monitor pin Q1 in accordance with I/O control signal IOCON and data latch control signal DCON. That is, selecting control signal generating unit 900 receives a resultant voltage or current from one of test target pins A1 through A2$^N$, and provides the resultant voltage or current to monitor pin Q1 in accordance with I/O control signal IOCON and data latch control signal DCON. The individual testing of test target pins A1 through A2$^N$ of semiconductor memory device 510-X is also controlled using I/O control signal IOCON and data latch control signal DCON. Selecting signal switching unit 700 receives selecting signals S[2] through S[M] through selecting pins Q2 through QM of selecting signal input unit 750 and outputs selecting signals S[2] through S[M] in response to I/O control signal IOCON of switching controller 800.

Selecting control signal generating unit 900 receives data latch control signal DCON from switching controller 800, receives selecting signals S[2] through S[M] from selecting signal switching unit 700, outputs selecting control signals SCON1 through SCON$2^N$ to select a test target pin AY from among test target pins A1 through A$2^N$ (wherein Y is an integer between 1 and $2^N$, inclusive) from which to receive a resultant signal RSIG (i.e., a resultant voltage or current) through input switching unit 600, and outputs resultant signal RSIG to output switching unit TB2-1.

Input switching unit 600 receives selecting control signals SCON1 through SCON$2^N$ from selecting control signal generating unit 900 to select test target pin AY from among test target pins A1 through A$2^N$, and outputs the resultant voltage or current received from selected test target pin AY to selecting control signal generating unit 900. Selecting control signal generating unit 900 outputs the resultant voltage or current received from selected test target pin AY to output switching unit TB2-1, and output switching unit TB2-1 outputs the resultant voltage or current to monitor pin Q1 in response to I/O control signal IOCON of switching controller 800. Monitor pin Q1 measures the voltage or current level of the resultant current or voltage received from output switching unit TB2-1 to determine whether or not the resultant voltage or current is substantially equal to the test voltage or current applied to selected test target pin AY. That is, monitor pin Q1 tests whether or not the test voltage or current has passed through test target pin AY normally, and thereby tests whether or not a short circuit has occurred in semiconductor memory device 510-X at test target pin AY.

FIG. 6 is a circuit diagram illustrating switching controller 800 of semiconductor memory device 510-X illustrated in FIG. 5. Switching controller 800 comprises a first delay circuit 810 and a pulse generator 840. First delay circuit 810 comprises a plurality of inverters IN1-1 through IN1-J, wherein J is an even, positive integer. Pulse generator 840 comprises a NAND gate NAND, an inverter IN4, and a second delay circuit 830 comprising a plurality of inverters IN3-1 through IN3-L, wherein L is an odd, positive integer. Switching controller 800 also comprises a third delay circuit 820 comprising a plurality of inverters IN2-1 through IN2-K, wherein K is an even, positive integer and K is greater than J. Switching controller 800 receives test enable signal BPEN from test enable pin ENB (see FIG. 5) and inputs test enable signal BPEN to first delay circuit 810. First delay circuit 810 outputs, through the even number of inverters IN1-1 through IN1-J, a delayed signal B to second and third delay circuits 830 and 820, and to NAND gate NAND. Second delay circuit 830 outputs, through the odd number of inverters IN3-1 through IN3-L, a delayed signal C. Third delay circuit 820 outputs, through the even number of inverters IN2-1 through IN2-K, I/O control signal IOCON. In addition, switching controller 800 provides delayed signals B and C to NAND gate NAND, inverts the output of NAND gate NAND using inverter IN4, and outputs the output of inverter IN4 as data latch control signal DCON.

Figure 7:
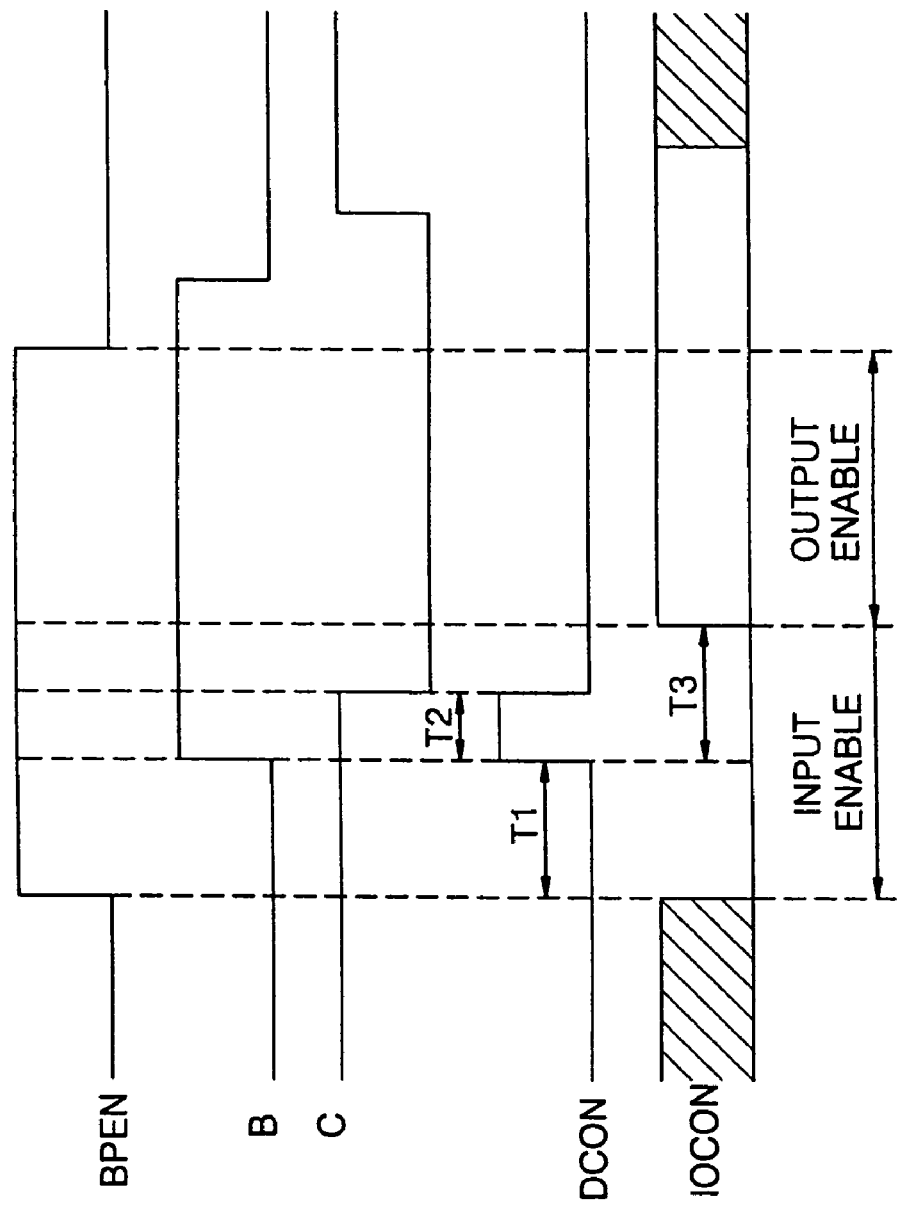
FIG. 7 is a timing diagram illustrating an operation of the switching controller of FIG. 6; and, FIG. 8 is a circuit diagram illustrating a selecting control signal generating unit of the semiconductor memory device of FIG. 5.

FIG. 7 is a timing diagram illustrating an operation of switching controller 800 of FIG. 6. In FIG. 7 shows test enable signal BPEN, delayed signal B, delayed signal C, data latch control signal DCON, and I/O control signal IOCON.

When test enable signal BPEN transitions from a logic low level to a logic high level, maintains the logic high level for a predetermined amount of time, and then transitions back to the logic low level, delayed signal B transitions to a logic high level after a first time period T1 has elapsed from the transitioning of test enable signal BPEN from the logic low level to the logic high level. In addition, delayed signal C transitions to a logic low level (by providing inverted delayed signal B as delayed signal C) after a time period equal to T1+T2 (wherein T2 is a second time period) has elapsed from the transitioning of test enable signal BPEN from the logic low level to the logic high level. Data latch control signal DCON exhibits a logic high level during second time period T2 (which may be referred to herein as a "data latch control signal DCON pulse") through a logical combination of delayed signals B and C. That is, data latch control signal DCON transitions to a logic high level when delayed signal B transitions to a logic high level, and transitions to a logic low level when delayed signal C transitions to a logic low level while delayed signal B maintains a logic high level. I/O control signal IOCON maintains a low level during first time period T1 after test enable signal BPEN has transitioned from a logic low level to a logic high level and during a third time period T3 after first time period T1. While test enable signal BPEN maintains a logic high level, the time period during which I/O control signal IOCON maintains a logic low level is an input enable stage during which test target pin AY is selected, and the time period during which I/O control signal IOCON maintains a logic high level is an output enable stage during which the level of the resultant voltage or current received from test target pin AY is measured to determine whether or not the resultant voltage or current is substantially equal to the test voltage or current, and thus whether or not a short circuit has occurred in test target pin AY.

Figure 8:
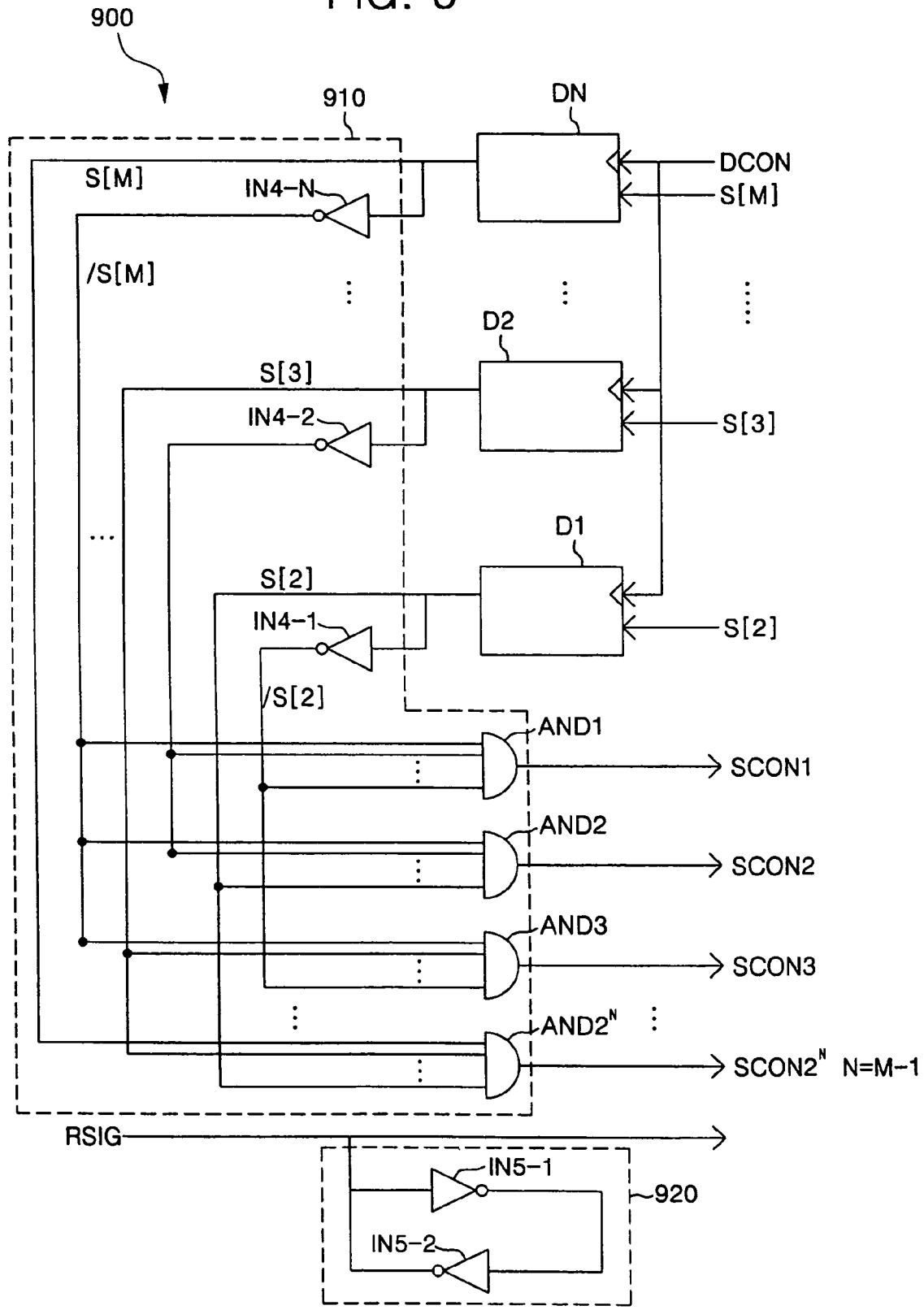

FIG. 8 is a circuit diagram illustrating selecting control signal generating unit 900 of semiconductor memory device 510-X of FIG. 5. Selecting control signal generating unit 900 comprises a terminal selecting controller 910, a repeater 920, and D flip flops D1 through DN (thus, the number of D flip flops D1 through DN is equal to N), wherein N is equal to (M−1). Terminal selecting controller 910 comprises N inverters IN4-1 through IN4-N, and $2^N$ AND gates AND1 through AND$2^N$. Repeater 920 comprises 2 inverters IN5-1 and IN5-2.

D flip flops D1 through DN receive selecting signal S[2] through S[M] from selecting signal switching unit 700 of FIG. 5, receive data latch control signal DCON from switching controller 800, and respectively output selecting signals S[2] through S[M] in response to and synchronized with receiving data latch control signal DCON. Inverters IN4-1 through IN4-N respectively receive selecting signals S[2] through S[M] and respectively output inverted selecting signals /S[2] through /S[M], which correspond respectively to selecting signals S[2] through S[M]. Terminal selecting controller 910 uses AND gates AND1 through AND$2^N$ to logically combine, in a total of $2^N$ combinations, signals selected from the group of signals consisting of output signals S[2] through S[M] and inverted output signals /S[2] through /S[M]. Terminal selecting controller 910 provides the $2^N$ combinations of signals to AND gates AND1 through AND$2^N$ and outputs the outputs of AND gates AND1 through AND$2^N$ as selecting control signals SCON1 through SCON$2^N$, respectively. The preceding process of generating selecting control signals SCON1 through SCON$2^N$ using selecting signals S[2] through S[M] may be referred to herein as "decoding" selecting signals S[2] through S[M]. Resultant signal RSIG (i.e., a resultant voltage or current signal) is applied from selected test target pin AY to repeater 920 by the operation of input switching unit 600 of FIG. 5. Resultant signal RSIG is then communicated from repeater 920 to the input terminal of tri-state buffer TB2-1, which is output switching unit TB2-1 of FIG. 5.

An operation for testing semiconductor memory device 510-X, in accordance with an embodiment of the invention, will be described below with reference to FIGS. 5 through 8.

When test enable signal BPEN having a logic high level is applied to test enable pin ENB, switching controller 800 generates the data latch control signal DCON pulse, provides the data latch control signal DCON pulse to the control terminals of b flip flops D1 through DN of selecting control signal generating unit 900, and outputs I/O control signal IOCON having a logic low level to the control terminals of inverted-control tri-state buffers TB2-2 through TB2-M of selecting signal switching unit 700. When inverted-control tri-state buffers TB2-2 through TB2-M receive I/O control signal IOCON having a logic low level, inverted-control tri-state buffers TB2-2 through TB2-M, and thus selecting signal switching unit 700, is input-enabled, so inverted-control tri-state buffers TB2-2 through TB2-M are opened and thus provide selecting signals S[2] through S[M] from selecting signal input portion 750 to the input terminals of D flip flops D1 through DN of selecting control signal generating unit 900. In addition, in response to data latch control signal DCON, D flip flops D1 through DN provide selecting signals S[2] through S[M] to terminal selecting controller 910.

Terminal selecting controller 910 decodes selecting signals S[2] through S[M] and provides selecting control signals SCON1 through SCON$2^N$ to the control terminals of tri-state buffers TB1-1 through TB1-$2^N$ to open a selected tri-state buffer TB1-Y corresponding to selected test target pin AY. Selecting signals S[2] through S[M] may each have either a logic high level or a logic low level, so each of selecting signals S[2] through S[M] may function as a binary value. Thus, selecting signals S[2] through S[M] may be used to individually set any one of selecting control signals SCON1 through SCON$2^N$ to a logic high level because N=M−1 and the number of selecting signals S[2] through S[M] is (M−1). For example, when N=2 and M=3 there are 4 test target pins (A1 through A4) and 2 selecting pins (Q2 and Q3). In that example, test target pin A1 is selected when selecting signals S[2] and S[3] each have logic high levels causing SCON1 to have a logic high level, test target pin A2 is selected when selecting signal S[2] has a logic high level and selecting signal S[3] has a logic low level causing SCON2 to have a logic high level, test target pin A3 is selected when selecting signal S[2] has a logic low level and selecting signal S[3] has a logic high level causing SCON3 to have a logic high level, and test target pin A4 is selected when selecting signals S[2] and S[3] each have logic low levels causing SCON4 to have a logic high level. Resultant signal RSIG output from selected test target pin AY then passes through repeater 920 and is then output from selecting control signal generating unit 900 to output switching unit TB2-1.

Test enable signal BPEN passes through a plurality of inverters IN1-1 through IN1-J and IN2-1 through IN2-K of switching controller 800 illustrated in FIG. 6. Thus, I/O control signal IOCON transitions from a logic low level to a logic high level after a time period equal to T1+T3 has elapsed after test enable signal BPEN has transitioned from a logic low level to a logic high level, as shown in FIG. 7. I/O control signal IOCON then maintains the logic high level until a period of time has passed after test enable signal BPEN transitions back to a logic low level. During the time period during which both test enable signal BPEN and I/O control signal IOCON have a logic high level, which is the output enable stage, a logic high level is provided to the control terminal of tri-sate buffer TB2-1 (i.e., output switching unit TB2-1), so tri-state buffer TB2-1 provides resultant signal RSIG received from selecting control signal generating unit 900 to monitor pin Q1. As a result, since the resultant voltage or current (i.e., resultant signal RSIG) can be measured at monitor pin Q1, whether or not a short circuit has occurred in semiconductor memory device 510-X can be determined.

In the operation for testing semiconductor memory device 510-X described above, a short circuit test may be performed on semiconductor memory device 510-X of a plurality of semiconductor memory devices 510-1 through 510-D, wherein multiple of semiconductor memory devices 510-1 through 510-D are connected to the same first signal line set, regardless of whether semiconductor memory device 510-X has the same number of test target pins and monitor pins.

As described above, in the semiconductor memory module and the semiconductor memory device in accordance with embodiments of the invention, a signal line short circuit test can be performed on each semiconductor memory device of a plurality of semiconductor memory devices without using an additional test-dedicated pin or an algorithm for entering the test mode. In the signal line short circuit test, test target pins of the semiconductor memory device to be tested may be individually connected to a monitor pin of the semiconductor memory device to be tested or a plurality of test target pins may be connected to a plurality of monitor pins of the semiconductor memory device to be tested, wherein first signal lines of a first signal line set are connected to the test target pins, and a first signal line set is connected to multiple semiconductor memory devices of a plurality of semiconductor memory devices. Thus, the short circuit test may be readily performed.

Although embodiments of the invention have been described herein, various modifications may be made to the embodiments by one of ordinary skill in the art without departing from the scope of the invention as defined by the accompanying claims.

What is claimed is:

1. A semiconductor memory module comprising:
   a plurality of semiconductor memory devices adapted to operate during a test mode and a normal operation mode; and
   a circuit board having the plurality of semiconductor memory devices mounted thereon, a first signal line set comprising a plurality of first signal lines commonly connected to the plurality of semiconductor memory devices and a plurality of second signal line sets individually connected to the plurality of semiconductor memory devices,
   wherein each semiconductor memory device comprises:
      first terminals adapted to receive first signals from the first signal lines;
      second terminals connected to a corresponding one of the second signal line sets;
      a third terminal adapted to receive an enable signal during the test mode; and,
      a signal transmitting unit connected to the first terminals and adapted to output second signals to the second terminals in response to the enable signal,
      wherein the second terminals are adapted to output the second signals.

2. The module of claim 1, wherein:
   the first terminals are adapted to receive a control signal during the normal operation mode;
   the third terminal does not receive any signal during the normal operation mode; and, the second terminals are adapted to output data during the normal operation mode.

3. The module of claim 1, wherein:
the second signals correspond respectively to the first signals; and,
each second signal has the same voltage level as a corresponding one of the first signals or each second signal has the same current value as the corresponding one of the first signals.

4. The module of claim 1, wherein the signal transmitting unit comprises a plurality of tri-state buffers.

5. A semiconductor memory device adapted to operate during a test mode and a normal operation mode comprising:
an input switching unit adapted to:
receive first signals from a plurality of first terminals;
receive an enable signal from a second terminal during the test mode; and,
provide the first signals to an output switching unit; and,
an output switching unit adapted to:
receive the enable signal from the second terminal during the test mode; and,
output the first signals to third terminals in response to the enable signal.

6. The device of claim 5, wherein:
the first terminals are adapted to receive a control signal during the normal operation mode;
the second terminal does not receive any signal during the normal operation mode; and,
the third terminals are adapted to output data during a normal operation mode.

7. The device of claim 5, wherein:
the input switching unit comprises a first plurality of tri-state buffers; and,
the output switching unit comprises second a plurality of tri-state buffers.

8. The device of claim 5, wherein:
the input switching unit comprises a plurality of tri-state buffers, wherein each of the tri-state buffers comprises:
an input terminal connected to one of the first terminals;
a control terminal adapted to receive the enable signal; and,
an output terminal connected to the output switching unit; and,
each of the tri-state buffers is opened in response to an enable signal to provide the first signals to the output switching unit.

9. The module of claim 5, wherein:
the output switching unit comprises a plurality of tri-state buffers, wherein each of the tri-state buffers comprises:
an input terminal connected to the input switching unit;
a control terminal adapted to receive an enable signal; and,
an output terminal connected to one of the third terminals; and,
each of the tri-state buffers is opened in response to an enable signal to provide the first signals to the third terminals.

10. A semiconductor memory module comprising:
a plurality of semiconductor memory devices adapted to operate during a test mode and a normal operation mode; and
a circuit board having the plurality of semiconductor memory devices mounted thereon, a first signal line set comprising a plurality of first signal lines commonly connected to the plurality of semiconductor memory devices and a plurality of second signal line sets individually connected to the plurality of semiconductor memory devices,
wherein each semiconductor memory device comprises:
first terminals adapted to receive first signals from the first signal lines;
second terminals connected to a corresponding one of the second signal line sets and adapted to receive and output selecting signals during the test mode;
a third terminal adapted to receive an enable signal during the test mode;
a selecting control signal generating unit adapted to logically combine the selecting signals to generate and output selecting control signals in accordance with the enable signal;
an input switching unit adapted to output a second signal in response to the selecting control signals; and,
a fourth terminal adapted to output the second signal received from the input switching unit.

11. The module of claim 10, wherein:
the second signal corresponds to one of the first signals; and,
the second signal has the same voltage level as the corresponding one of the first signals or the second signal has the same current value as the corresponding one of the first signals.

12. The memory module of claim 10, wherein:
each of the semiconductor memory devices further comprises a switching controller adapted to output first and second control signals in accordance with receiving the enable signal; and,
each semiconductor memory device provides the second signal to the fourth terminal in accordance with the first and second control signals.

13. The module of claim 10, wherein:
the first terminals are adapted to receive a control signal during a normal operation mode;
the third terminal does not receive any signal during a normal operation mode; and,
the seconds terminal are adapted to output data during a normal operation mode.

14. The module of claim 10, wherein the input switching unit comprises a plurality of tri-state buffers.

15. A semiconductor memory device adapted to operate during a test mode and normal operation mode comprising:
a selecting control signal generating unit connected to an output switching unit;
an input switching unit connected to the selecting control signal generating unit;
a plurality of first terminals connected to the input switching unit and adapted to receive first signals;
a plurality of second terminals adapted to provide a plurality of selecting signals to the selecting control signal generating unit; and,
a switching controller adapted to provide a first control signal to the output switching unit in accordance with receiving an enable signal from a third terminal and adapted to provide a second control signal to the selecting control signal generating unit in accordance with receiving the enable signal, wherein:
the selecting control signal generating unit is adapted to:
provide selecting control signals to the input switching unit to select one of the first terminals;
receive a second signal from the selected first terminal; and,
provide the second signal to the output switching unit;

the input switching unit is adapted to provide the second signal from the selected first terminal to the selecting control signal generating unit; and, the output switching unit is adapted to provide the second signal to a fourth terminal in response to the first control signal.

16. The device of claim 15, wherein:

the selected first terminal is adapted to receive a selected first signal; and, the second signal has the same voltage level as the selected first signal or the second signal has the same current value as the selected first signal.

17. The device of claim 15, further comprising a selecting signal switching unit comprising a plurality of tri-state buffers, wherein each tri-state buffer comprises:

an input terminal connected to one of the second terminals;

a control terminal adapted to receive the first control signal; and, an output terminal connected to the selecting control signal generating unit.

18. The device of claim 15, further comprising a selecting signal switching unit adapted to receive the plurality of selecting signals from the second terminals and provide the plurality of selecting signals to the selecting control signal generating unit in response to the first control signal.

19. The device of claim 15, wherein:

the first terminals are adapted to receive a control signal during the normal operation mode;

the third terminal does not receive any signal during the normal operation mode; and, the second terminals are adapted to output data during the normal operation mode.

20. The device of claim 15, wherein:

the input switching unit comprises a plurality of first tri-state buffers; and, the output switching unit comprises a second tri-state buffer.

21. The device of claim 15, wherein the switching controller comprises:

a first delaying unit adapted to receive the enable signal and output a first delayed signal a first amount of time after receiving the enable signal;

a pulse generator adapted to receive the first delayed signal and comprising a second delaying unit, wherein:

the second delaying unit is adapted to receive the first delayed signal and output a second delayed signal a second amount of time after receiving the first delayed signal, wherein the second delayed signal has a logic level opposite the logic level of the first delayed signal;

the pulse generator is adapted to logically combine the first and second delayed signals to produce the second control signal; and, the pulse generator is adapted to output the second control signal; and, a third delaying unit adapted to receive the first delayed signal and output the first control signal a third amount of time after receiving the first delayed signal, wherein the first control signal has the same logic level as the first delayed signal.

22. The device of claim 15, wherein the selecting control signal generating unit comprises:

a plurality of D flip flops adapted to:

receive the plurality of selecting signals from the plurality of second terminals;

receive the second control signal from the switching controller; and, output the selecting signals;

a terminal selecting controller comprising a plurality of inverters, wherein:

the inverters are adapted to invert the selecting signals and output inverted selecting signals;

the terminal selecting controller is adapted to logically combine groups of signals, wherein each group of signals comprises signals selected from the group consisting of the selecting signals and the inverted selecting signals; and, the terminal selecting controller is adapted to output a plurality of selecting control signals; and, a repeater adapted to receive and output the second signal.

23. The device of claim 15, wherein the input switching unit comprises $2^N$ tri-state buffers, wherein:

each tri-state buffer comprises:

an input terminal connected to one of the first terminals;

a control terminal adapted to receive one of the selecting control signals; and, an output terminal connected to the selecting control signal generating unit; and, N is a positive integer greater than 0 and the number of second terminals in the plurality of second terminals.

24. The device of claim 23, wherein the input switching unit is adapted to receive the selecting control signals to open a selected tri-state buffer to thereby provide the second signal to the selecting control signal generating unit, wherein the selected tri-state buffer receives the second signal from the selected first terminal.

25. The device of claim 15, wherein the output switching unit comprises a tri-state buffer comprising an input terminal connected to the selecting control signal generating unit, a control terminal adapted to receive the first control signal, and an output terminal connected to the fourth terminal.

26. The device of claim 25, wherein the tri-state buffer is opened in response to the first control signal to thereby provide the second signal to the fourth terminal.

* * * * *